United States Patent
Ikezu (10) Patent No.: US 6,388,855 B1
(45) Date of Patent: May 14, 2002

(54) TRANSISTOR PROTECTING CIRCUIT WITH ENHANCING CIRCUIT FOR H BRIDGE CIRCUIT

(75) Inventor: Shigeki Ikezu, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/536,154

(22) Filed: Mar. 28, 2000

(30) Foreign Application Priority Data

Apr. 7, 1999 (JP) .......................................... 11-099802

(51) Int. Cl.⁷ ................................................. H02H 3/24
(52) U.S. Cl. ...................................................... 361/100
(58) Field of Search ........................ 361/100; 323/324; 320/155

(56) References Cited

U.S. PATENT DOCUMENTS

| | | | | |
|---|---|---|---|---|
| 5,126,603 A | * | 6/1992 | Hattori | 327/1 |
| 6,046,551 A | * | 1/2000 | Kita | 315/307 |

FOREIGN PATENT DOCUMENTS

| | | |
|---|---|---|
| JP | H1-91620 | 4/1989 |
| JP | H2-58372 | 2/1990 |
| JP | H4-331492 | 11/1992 |
| JP | H8-55958 | 2/1996 |
| JP | H8-163885 | 6/1996 |

* cited by examiner

*Primary Examiner*—Jessica Han
*Assistant Examiner*—Pia Tibbits
(74) *Attorney, Agent, or Firm*—Sughrue Mion, PLLC (57) ABSTRACT

A transistor protecting circuit for an H bridge circuit includes first to fourth buffers, and an enhancing circuit. The H bridge circuit includes a first P-channel transistor and a first N-channel transistor connected in series between a first power supply and a ground, and a second P-channel transistor and a second N-channel transistor connected in series between the first power supply and the ground. The first buffer inverts a first control signal to supply to a gate of the first P-channel transistor, and the second buffer inverts a second control signal to supply to a gate of the first N-channel transistor. Also, the third buffer inverts a third control signal to supply to a gate of the second P-channel transistor, and the fourth buffer inverts a fourth control signal to supply to a gate of the second N-channel transistor. The third and fourth control signals are inverted signals of the first and second control signals. The enhancing circuit selectively flows current into or from one of the first to fourth lines based on the first to the fourth control signals.

6 Claims, 8 Drawing Sheets

TRANSISTOR PROTECTING CIRCUIT WITH ENHANCING CIRCUIT FOR H BRIDGE CIRCUIT

BACKGROUND OF THE INVENTION

1. Field of the Invention

The present invention relates to a protecting circuit of a transistor.

2. Description of the Related Art

In recent years, a gate length is reduced with the improvement of process technique, so that the switching speed of a power MOS transistor is increased. As a result, the rising edge and falling edge of output current of the power MOS transistor become steep. Therefore, in the power MOS transistor, various problems, such as the change of a power supply voltage and the radiation of noise, are caused by the steep change of the output current.

Figure 1:
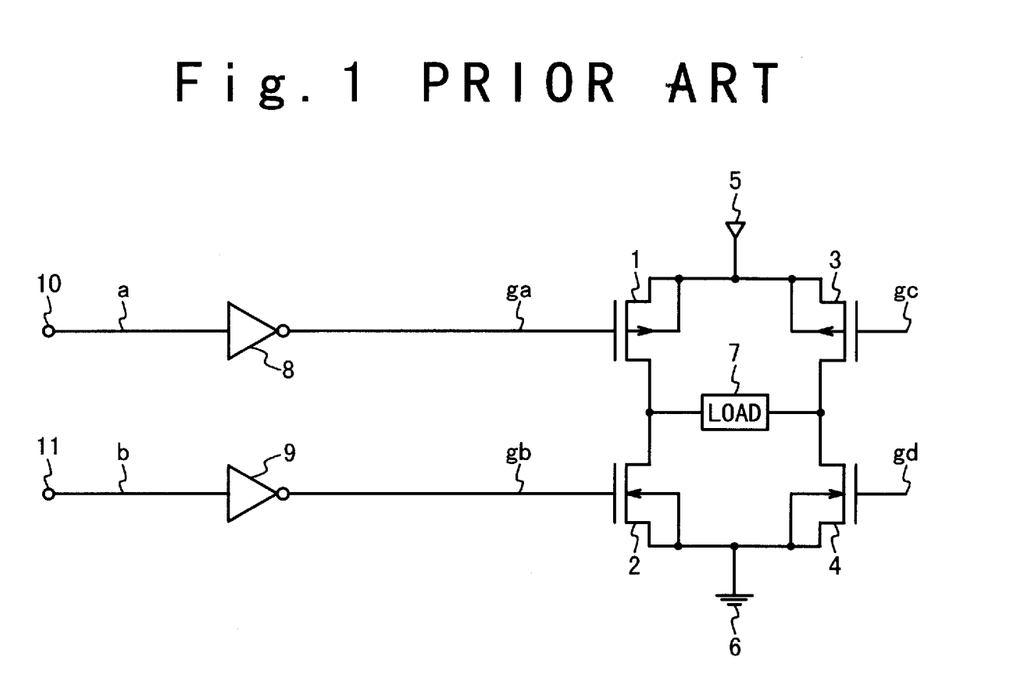
FIG. 1 is a conventional example of a driving circuit for an H bridge circuit.
Figure 2:
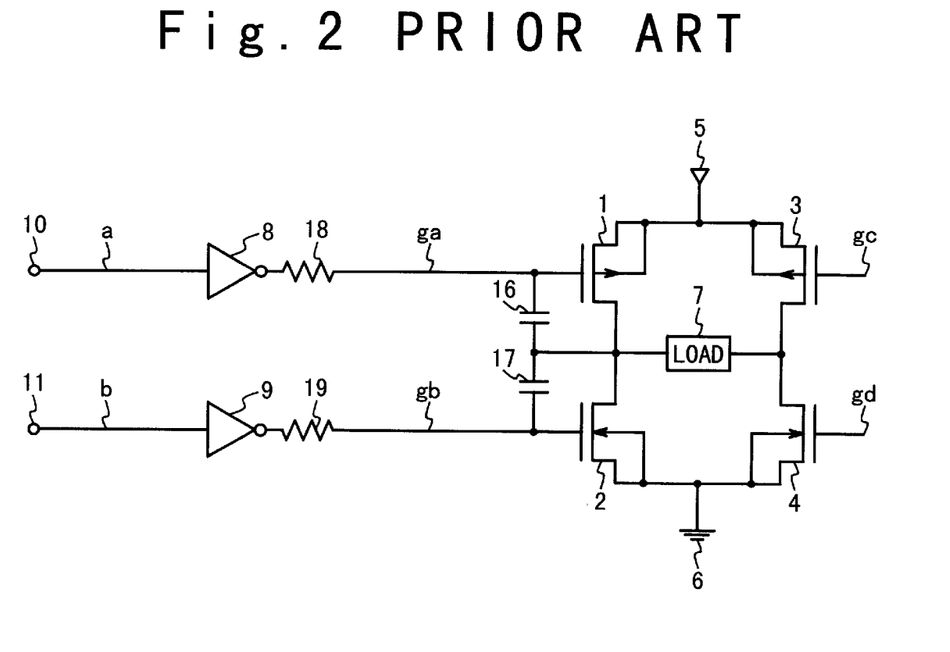
FIG. 2 is a circuit diagram of an equivalent circuit of the conventional example of the driving circuit for the H bridge circuit.
Figure 3A:
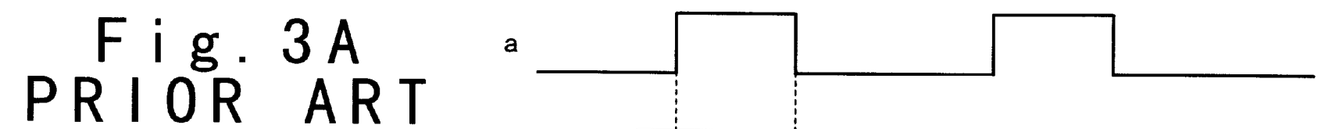
FIGS. 3A to 3F are timing charts of operation signals in the driving circuit of FIG. 1.
Figure 3B:
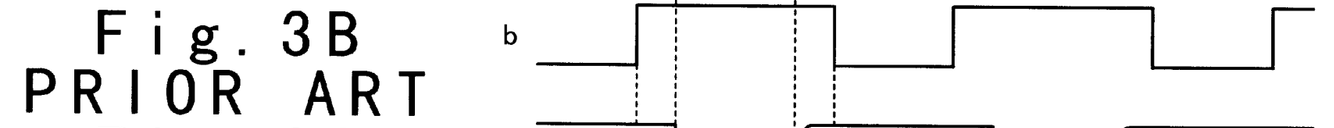
Figure 3C:
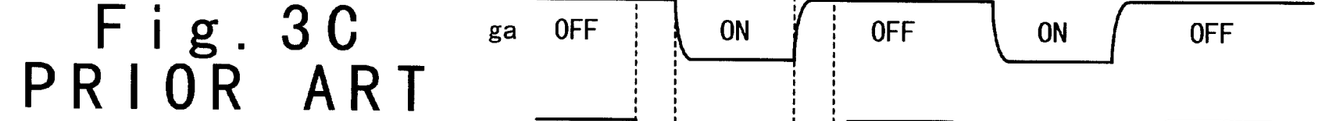
Figure 3D:
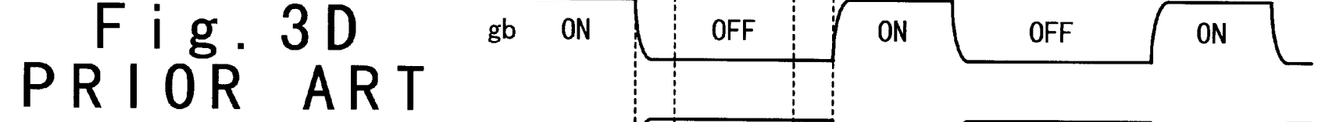
Figure 3E:
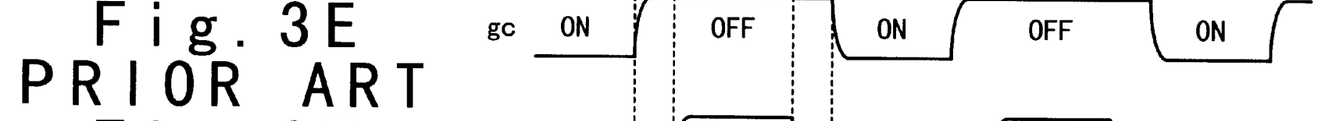
Figure 3F:
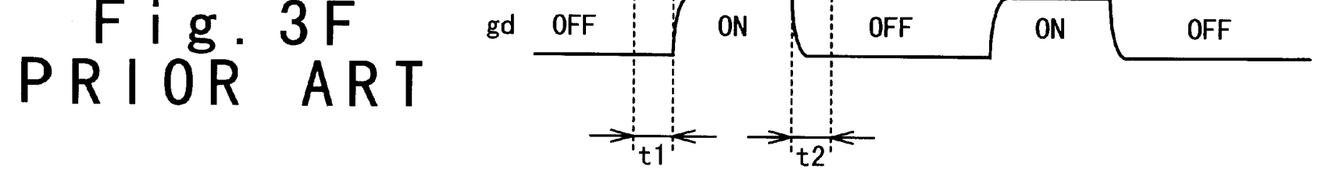
Figure 4A:
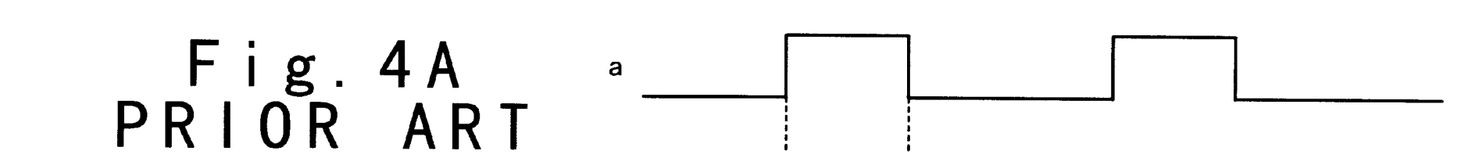
FIGS. 4A to 4D are timing charts showing operation signals in the driving circuit of FIG. 2.
Figure 4B:
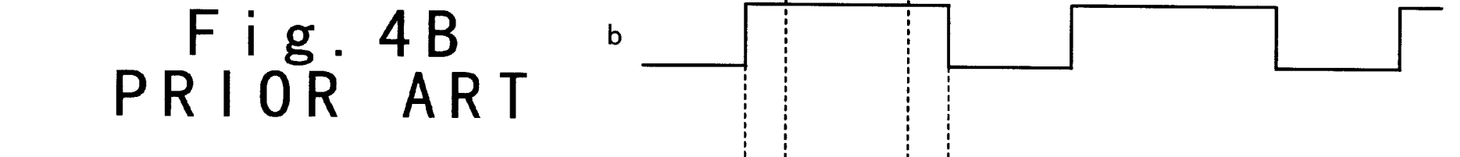
Figure 4C:
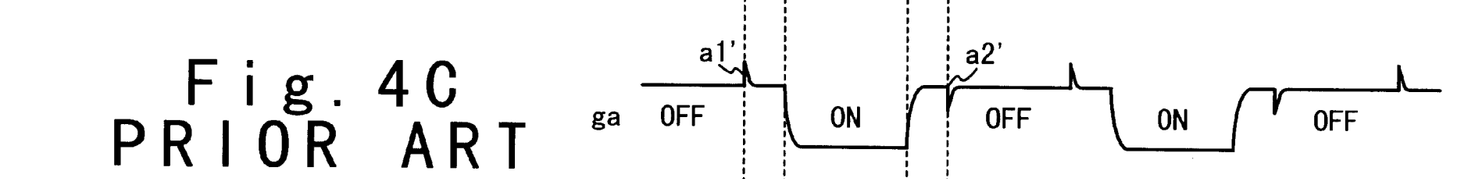
Figure 4D:
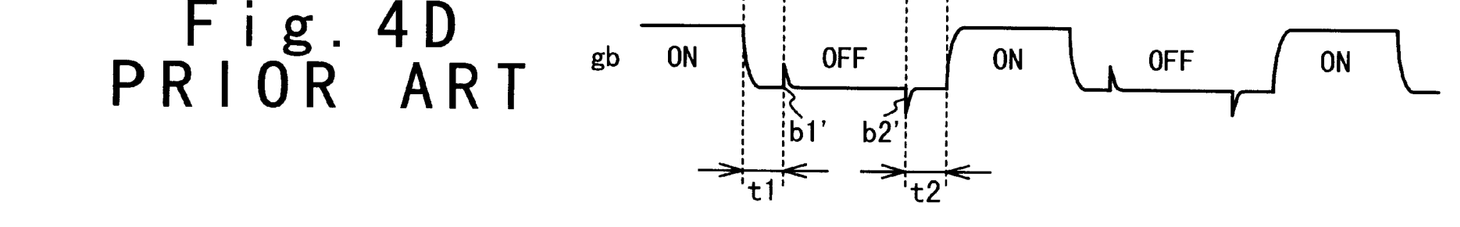

Generally, as shown in FIGS. 1 and 2, the gates of power MOS transistors 1 and 2 are driven with gate signals from inverters (buffers) 8 and 9, respectively. Therefore, conventionally, the sizes of output transistors in the buffers 8 and 9 are adjusted such that output resistances are made large. Instead, high resistances 18 and 19 are inserted between the buffers 8 and 9 and the gates of the power MOS transistors 1 and 2 to make the gate signals less steep by the resistances 18 and 19 and capacitances 16 and 17 between and the gates and drains of the power MOS transistors 1 and 2. As a result, a rising time and a falling time are made long in the output current waveforms of the power MOS transistors 1 and 2.

However, in a first conventional example, the ability to drive the gate of the power MOS transistor is reduced. When the voltage of a load connection terminal changes by a large amount, charging and discharging currents flow through the capacitance 16 or 17 between the gate and the drain. In this case, the voltage levels a1' and a2', and b1' and b2' of the gate signals ga and gb is changed, as shown in FIG. 8. As a result, the power MOS transistor 1 or the power MOS transistor 2 is erroneously turned on, so that the current flows between the power supply and the ground. When the gate voltages exceed the breakdown voltages of the power MOS transistors 1 and 2, the power MOS transistors 1 and 2 are possibly destroyed.

In conjunction with the above description, an H bridge protecting circuit is known in Japanese Laid Open Patent Application (JP-A-Heisei 1-91620). In this reference, an H bridge circuit is composed of a direct current power supply and four semiconductor devices. A control circuit controls each of the four semiconductor devices to be in a conductive or non-conductive state such that a motor is rotated in a positive direction or in an reverse direction. A stopping circuit detects an over-voltage or a surge voltage generated in the direct current power supply and controls all the four semiconductor devices to set to the non-conductive state. An over-current detecting circuit detects an over-current flowing through any of the four semiconductor devices. When the over-current detecting circuit detects the over-current, the stopping circuit controls all the four semiconductor devices to set to the non-conductive state.

Also, a semiconductor circuit apparatus is known in Japanese Laid Open Patent Application (JP-A-Heisei 2-58372). In this reference, a vertical type insulating gate field effect element is used as a pull-up element, in which a semiconductor substrate is used as a drain or an anode terminal. Also, an insulating gate field effect element is used as a pull-down element, which is formed in an N-type region separated by a P-type region.

Also, a through current preventing circuit is known in Japanese Laid Open Patent Application (JP-A-Heisei 4-331492). In this reference, an H bridge circuit is composed of two P-channel MOS transistors (9, 10) and two N-channel MOS transistors (11, 12). A through current preventing circuit is composed of first and second buffer circuits (16) in which a rising time of an output signal is longer than a falling time of the output signal, third and fourth buffer circuits (18) in which a falling time of an output signal is longer than a rising time of the output signal, and fifth and eighth buffer circuits, (17, 19) in which a rising time of an output signal is equal to a falling time of the output signal. As a result, there is no operation period of all the MOS transistors (9 to 12). Thus, the through current can be prevented. A high frequency operation of the H bridge circuit is made possible if the duty ratios of drive signals (1 and 2) are determined in consideration of a non-operation period.

Also, an electrostatic discharge(ESD) protecting circuit is known in Japanese Laid Open Patent Application (JP-A-Heisei 8-55958 corresponding to U.S. patent application No. 08/280417). In this reference, the ESD protecting circuit is composed of a first $n^+$-type diode whose cathode is connected to a pad and whose anode is connected to a substrate ground. The first diode is composed of a substrate of one of a $P^-$-type and a $P^-$ on $P^+$-type epitaxial type, and an $N^+$-type region deposited on the substrate. Also, the first diode is further composed of a $P^+$-type region deposited on the substrate and connected to the substrate ground, and a field oxidation film region formed to electrically insulate the $N^+$-type region from the $P^+$-type region. Also, the first diode is further composed of an N-type well surrounding the $N^+$-type region to prevent avalanche from being generated in the first diode in response to an input voltage applied to the pad and lower than a predetermined voltage.

Also, a voice coil motor feedback control circuit is known in Japanese Laid Open Patent Application (JP-A-Heisei 8-163885 corresponding to U.S. patent application Ser. No. 08/300952). In this reference, the voice coil motor feedback control circuit is composed of an H bridge circuit (10), a controller (20) and a feed back loop (60). The feed back loop (60) prevents the voltage applied to the voice coil motor from increasing due to counter-electromotive force.

SUMMARY OF THE INVENTION

Therefore, an object of the present invention is to provide a transistor protecting circuit.

Another object of the present invention is to provide a transistor protecting circuit which can prevents an erroneous operation of a transistor and the destruction of the transistor.

Still another object of the present invention is to provides a transistor protecting circuit which can prevent through current from flowing between a power supply and the ground.

Yet still another object of the present invention is to provide a transistor protecting circuit in which the current drive ability to a gate of a transistor is enhanced.

It is another object of the present invention is to provide a transistor protecting circuit which is provided with an inverter, an RS latch, and an enhancing transistor.

In order to achieve an aspect of the present invention, a transistor protecting circuit for an H bridge circuit includes first to fourth buffers, and an enhancing circuit. The H bridge circuit includes a first P-channel transistor and a first N-channel transistor provided between a first power supply and a ground to be connected in series through a first node, and a second P-channel transistor and a second N-channel transistor provided between the first power supply and the ground to be connected in series through a second node. A load is connected between the first node and the second node. The first buffer inverts a first control signal to a first gate signal which is supplied to a gate of the first P-channel transistor via a first line, and the second buffer inverts a second control signal to a second gate signal which is supplied to a gate of the first N-channel transistor via a second line. Also, the third buffer inverts a third control signal a third gate signal which is supplied to a gate of the second P-channel transistor via a third line, and the fourth buffer inverts a fourth control signal to a fourth gate signal which is supplied supply to a gate of the second N-channel transistor via a fourth line. The third and fourth control signals are inverted to the first and second gate signals. The enhancing circuit selectively passes current into or from one of the first to fourth lines based on the first to the fourth control signals.

Here, the enhancing circuit passes first current onto the first line when the first N-channel transistor is turned on in response to the second gate signal while the first P-channel transistor is in an off state in response to the first gate signal, and supplies second current from the second line when the first P-channel transistor is turned on in response to the first gate signal while the first N-channel transistor is in an off state in response to the second gate signal. Also, the enhancing circuit passes third current onto the third line when the second N-channel transistor is turned on in response to the fourth gate signal while the second P-channel transistor is in an off state in response to the third gate signal, and passes fourth current from the fourth line when the second P-channel transistor is turned on in response to the third gate signal while the second N-channel transistor is in an off state in response to the fourth gate signal.

Also, the enhancing circuit may include a first enhancing circuit and a second enhancing circuit. The first enhancing circuit is provided for the first P-channel transistor and the first N-channel transistor to selectively current into the first line and from the second line based on the first and second gate signals. Also, the second enhancing circuit is provided for the second P-channel transistor and the second N-channel transistor to selectively passes current into the third line and from the fourth line based on the third and fourth gate signals. In this case, the first enhancing circuit passes first current onto the first line when the first N-channel transistor is turned on in response to the second gate signal while the first P-channel transistor is in an off state in response to the first gate signal, and passes second current from the second line when the first P-channel transistor is turned on in response to the first gate signal while the first N-channel transistor is in an off state in response to the second gate signal. Also, the second enhancing circuit passes third current onto the third line when the second N-channel transistor is turned on in response to the fourth gate signal while the second P-channel transistor is in an off state in response to the third gate signal, and passes fourth current from the fourth line when the second P-channel transistor is turned on in response to the third gate signal while the second N-channel transistor is in an off state in response to the fourth gate signal. Also, the first enhancing circuit may include a first P-channel control transistor, a first N-channel control transistor and a first timing circuit. The second enhancing circuit may include a second P-channel control transistor, a second N-channel control transistor and a second timing circuit. The first P-channel control transistor is provided between a second power supply and the first line, and passes first current from the second power supply to the first line in response to a first drive signal. The first N-channel control transistor is provided between the ground and the second line, and passes second current from the second line to the ground in response to the first drive signal. The first timing circuit generates the first drive signal based on the first and second control signals. The second P-channel control transistor is provided between the second power supply and the third line, and passes third current from the second power supply to the third line in response to a second drive signal. The second N-channel control transistor is provided between the ground and the fourth line, and passes fourth current from the fourth line to the ground in response to the second drive signal. The second timing circuit generates the second drive signal based on the third and fourth control signals. In this case, the first timing circuit may include a first flip-flop circuit set in response to a rising edge of the first control signal and reset in response to a falling edge of an inversion signal of the second control signal. Also, the second timing circuit may include a second flip-flop circuit set in response to a rising edge of the third control signal and reset in response to a falling edge of an inversion signal of the fourth control signal.

Also, an internal resistor of the first buffer is larger than a sum of an internal resistor of the first P-channel control transistor and a resistive element provided between the first P-channel control transistor and the first line. An internal resistor of the second buffer is larger than a sum of an internal resistor of the first N-channel control transistor and a resistive element provided between the first N-channel control transistor and the second line. An internal resistor of the third buffer is larger than a sum of an internal resistor of the second P-channel control transistor and a resistive element provided between the second P-channel control transistor and the third line. An internal resistor of the fourth buffer is larger than a sum of an internal resistor of the second N-channel control transistor and a resistive element provided between the second N-channel control transistor and the fourth line.

In order to achieve another aspect of the present invention, a method of protecting an H bridge circuit is provided. In the H bridge circuit, a first P-channel transistor and a first N-channel transistor are provided between a first power supply and a ground to be connected in series through a first node, and a second P-channel transistor and a second N-channel transistor are provided between the first power supply and the ground to be connected in series through a second node. A load is connected between the first node and the second node. The first to fourth transistors having first to fourth capacitances each of which is a capacitance between a gate and a drain, respectively. The method includes: driving the first to fourth transistors through first to fourth lines in response to first to fourth control signals, respectively; and selectively charging the first to fourth third capacitances based on the first to the fourth control signals.

In this case, the charging operation includes: charging the first capacitance in response to turning on of the first N-channel transistor while the first P-channel transistor is in an off state; and charging the third capacitance in response to turning on of the second N-channel transistor while the second P-channel transistor is in an off state. Also, the charging operation includes: charging the second capacitance in response to turning on of the first P-channel transistor while the first N-channel transistor is in an off state; and charging the fourth capacitance in response to turning on of the second P-channel transistor while the second N-channel transistor is in an off state.

Also, when the method may further include generating first and second drive signals from the first to fourth control signals. At this time, the selectively charging operation includes: charging the first capacitance in response to the first drive signal; and charging the third capacitance in response to the second drive signal. Also, the selectively charging operation includes: charging the second capacitance in response to the first drive signal; and charging the fourth capacitance in response to the second drive signal. In this case, the generating operation includes: generating the first drive signal to have a high level in response to a rising edge of the first control signal and a low level in response to a falling edge of an inversion signal of the second control signal; and generating the second drive signal to have a high level in response to a rising edge of the third control signal and a low level in response to a falling edge of an inversion signal of the fourth control signal.

In order to achieve still another aspect of the present invention, a transistor protecting circuit for an H bridge circuit includes a driving section and an enhancing section. In the H bridge circuit, a first P-channel transistor and a first N-channel transistor are provided between a first power supply and a ground to be connected in series through a first node, and a second P-channel transistor and a second N-channel transistor are provided between the first power supply and the ground to be connected in series through a second node. A load is connected between the first node and the second node. The first to fourth transistors have first to fourth capacitances each of which is a capacitance between a gate and a drain, respectively. The driving section drives the first to fourth transistors through first to fourth lines in response to first to fourth control signals, respectively. The enhancing section selectively charges the first to fourth capacitances based on the first to the fourth control signals.

Here, the enhancing section may include a first charging section charging the first capacitance in response to turning on of the first N-channel transistor while the first P-channel transistor is in an off state; a second charging section for charging the third capacitance in response to turning on of the second N-channel transistor while the second P-channel transistor is in an off state; a third charging section charging the second capacitance in response to turning on of the first P-channel transistor while the first N-channel transistor is in an off state; and a fourth charging section for charging the fourth capacitance in response to turning on of the second P-channel transistor while the second N-channel transistor is in an off state.

Also, the enhancing section may include a generating section generating first and second drive signals from the first to fourth control signals, a first charging section charging the first capacitance in response to the first drive signal; a second charging section charging the third capacitance in response to the second drive signal; a third charging section charging the second capacitance in response to the first drive signal; and a fourth charging section charging the fourth capacitance in response to the second drive signal.

Also, the generating section may include a first generating section generating the first drive signal to have a high level in response to a rising edge of the first control signal and a low level in response to a falling edge of an inversion signal of the second control signal; and a second generating section generating the second drive signal to have a high level in response to a rising edge of the third control signal and a low level in response to a falling edge of an inversion signal of the fourth control signal.

Also, the first charging section includes a first P-channel control transistor, the first discharging section includes a first N-channel control transistor, the second charging section includes a second P-channel control transistor, and the second discharging section includes a second N-channel control transistor. In this case, a sum of an internal resistor of the first buffer and a resistive element provided between the first buffer and the first transistor gate is larger than a sum of an internal resistor of the first P-channel control transistor and a resistive element provided between the first P-channel control transistor and the first transistor gate. Also, a sum of an internal resistor of the second buffer and a resistive element provided between the second buffer and the second transistor gate is larger than a sum of an internal resistor of the first N-channel control transistor and a resistive element provided between the first N-channel control transistor and the second transistor gate. Also, a sum of an internal resistor of the third buffer and a resistive element provided between the third buffer and the third transistor gate is larger than a sum of an internal resistor of the second P-channel control transistor and a resistive element provided between the second P-channel control transistor and the third transistor gate. Also, a sum of an internal resistor of the fourth buffer and a resistive element provided between the fourth buffer and the fourth transistor gate is larger than a sum of an internal resistor of the second N-channel control transistor and a resistive element provided between the second N-channel control transistor and the fourth transistor gate.

DESCRIPTION OF THE PREFERRED EMBODIMENTS

Hereinafter, a transistor protecting circuit for an H bridge circuit of the present invention will be described below in detail with reference to the attached drawings.

Figure 5:
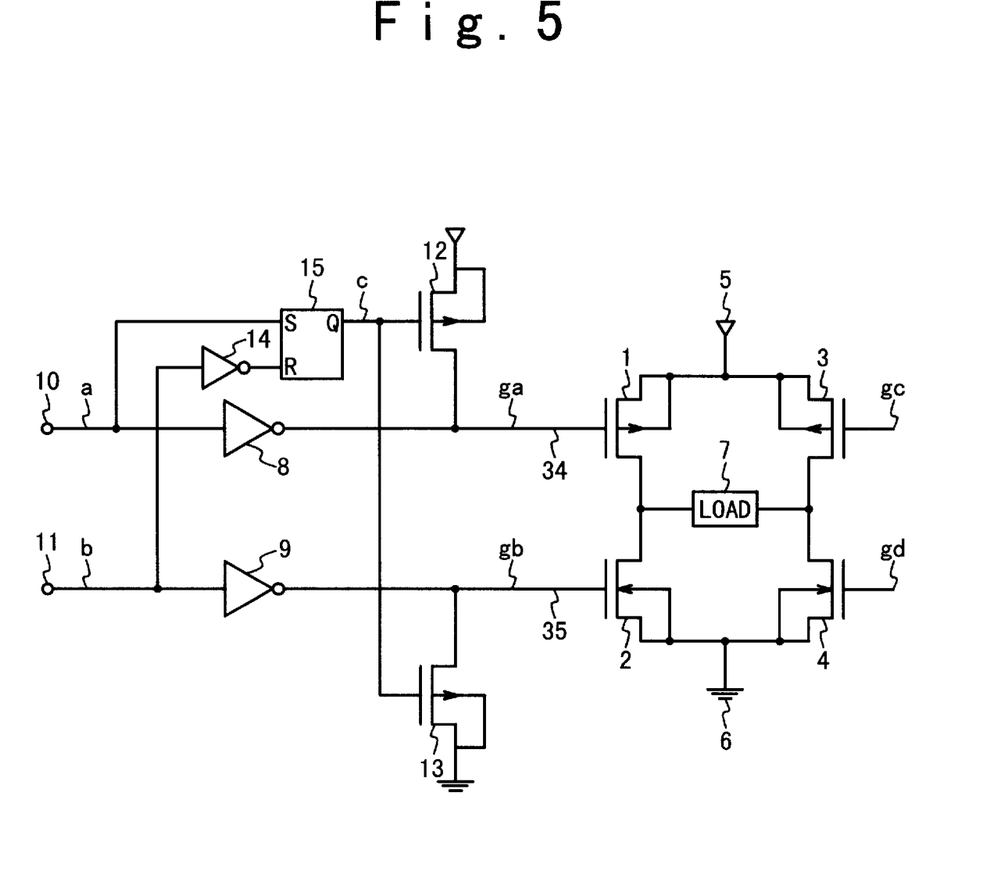
FIG. 5 is a circuit diagram showing the structure of a transistor protecting circuit for an H bridge circuit according to an embodiment of the present invention.
Figure 6:
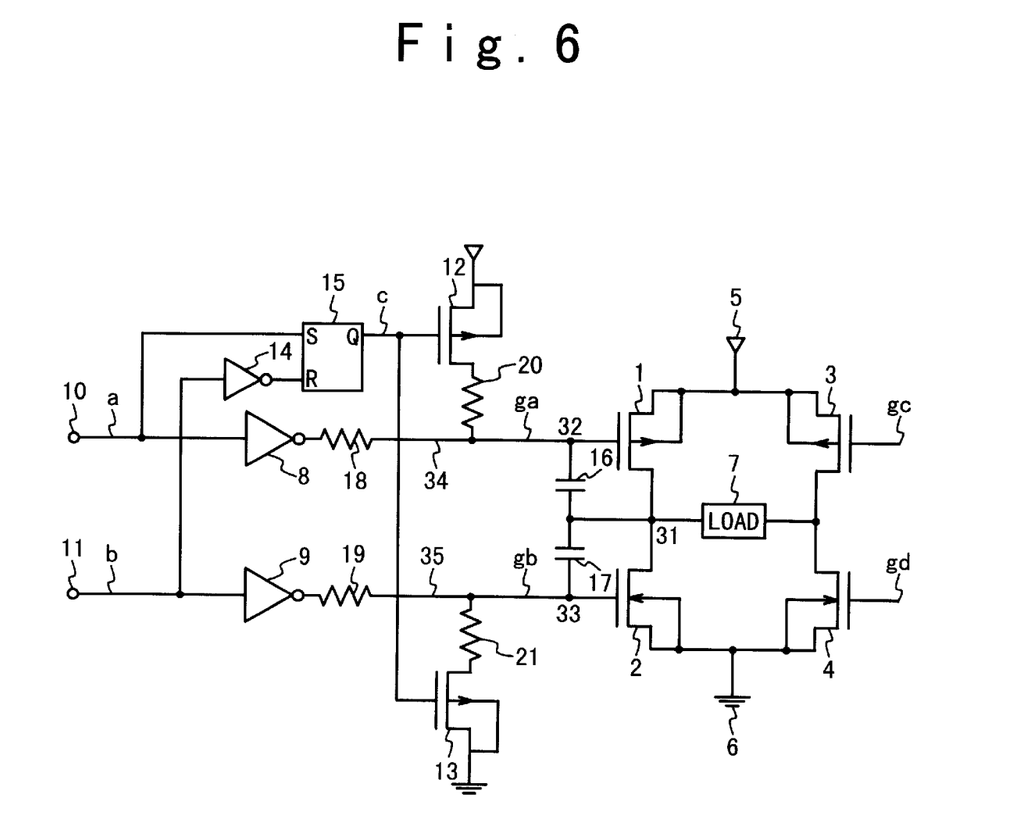
FIG. 6 is a circuit diagram of an equivalent circuit of the transistor protecting circuit for the H bridge circuit according to the embodiment of the present invention.

FIG. 5 is a circuit diagram showing the structure of the H bridge circuit which is composed of the transistor protecting circuit according to an embodiment of the present invention. FIG. 6 is a circuit diagram showing an equivalent circuit of FIG. 5.

As shown in FIG. 5, the H bridge circuit is composed of a P-channel power MOS transistor 1, an N-channel power MOS transistor 2, a P-channel power MOS transistor 3, an N-channel power MOS transistor 4, and a load 7. The P-channel power MOS transistor 1 and the N-channel power MOS transistor 2 are connected in series between the a power supply 5 and the ground 6. The P-channel power MOS transistor 3 and the N-channel power MOS transistor 4 are also connected in series between the power supply 5 and the ground 6. The load 7 is connected between a node between the P-channel power MOS transistor 1 and the N-channel power MOS transistor 2 and a node between the P-channel power MOS transistor 3 and the N-channel power MOS transistor 4.

A transistor protecting circuit drives the H bridge circuit. The transistor protecting circuit is composed of a first circuit to drive the power MOS transistors 1 and 2 and a second circuit to drive the power MOS transistors 1 and 2. The structure of the first circuit is the same as that of the second circuit. Therefore, only the first circuit of the transistor protecting circuit for the power MOS transistors 1 and 2 will be described.

The first circuit of the transistor protecting circuit is composed of inverters 8 and 9, an inverter 14, an RS latch 15 (timing circuit), and enhancing transistors 12 and 13. The inverters (buffers) 8 and 9 invert drive control signals a and b outputs gate signals the gates of the power MOS transistors 1 and 2 ga and gb, respectively via lines 34 and 35. The inverter 14 inverts the drive control signal band outputs a signal to an R terminal of the RS latch 15. The drive control signal a 10 is supplied to an S terminal of the RS latch 15. From a Q output of the RS latch 15 a signal c is supplied to the gates of the enhancing transistors 12 and 13 as a drive signal. The enhancing transistor 12 is provided between the power supply 5 and the line 34 and the enhancing transistor 13 is provided between the ground 6 and the line 35. The power supply of the enhancing transistor 12 may be same as the power supply 5 and may be different from the power supply 5. The enhancing transistor 12 supplies current to the gate of the power MOS transistor 1 via the line 34. Also, the enhancing transistor 13 passes current from the gate of the power MOS transistor 2 via the line 35. Thus, the transistor protecting circuit is designed to enhance the current drive ability to the gates of the power MOS transistors 1 and 2. In this way, the voltage changes of the gate signals ga and gb to the power MOS transistors 1 and 2 are restrained.

Also, FIG. 6 shows an equivalent circuit of the transistor protecting circuit and the H bridge circuit according to the embodiment of the present invention. In this figure, the transistor protecting circuit is composed of resistor elements 18, 19, 20 and 21 and capacitances 16 and 17. The resistor elements 18 and 19 are internal resistances of the inverters 8 and 9. The resistor elements 20 and 21 are ON resistances of the enhancing transistors 12 and 13. The capacitances 16 and 17 are capacitances between the gate and the drain of the power MOS transistor 1 and between the gate and the drain of the power MOS transistor 2 respectively. In this case, the inverter resistor element 18 >> the enhancing transistor ON resistor element 20 and the inverter output resistor element 19 >> the enhancing transistor ON resistor element 21.

Next, an operation of the transistor protecting circuit and the H bride circuit will be described below.

Figures 7A, 7B:
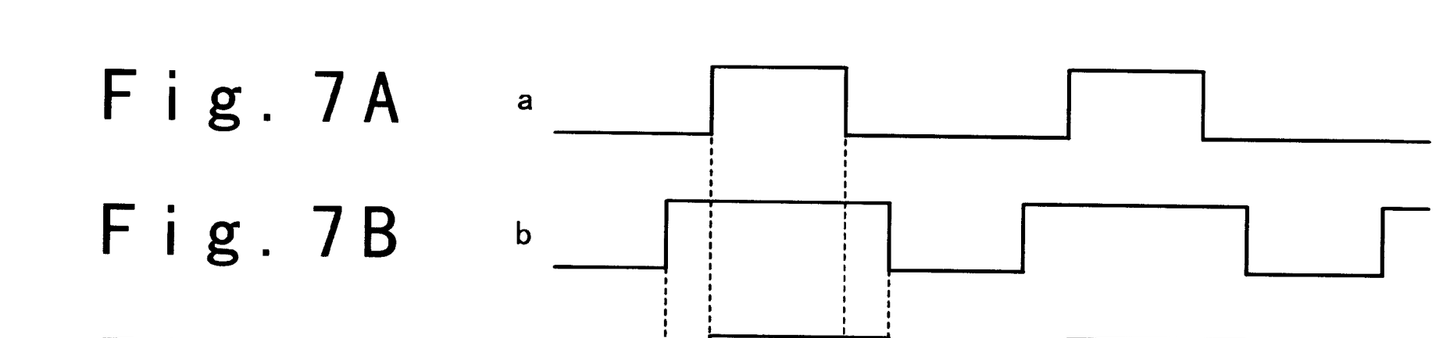
FIGS. 7A to 7E are timing charts of operation signals in the bridge circuit of FIG. 5.
Figure 7C:
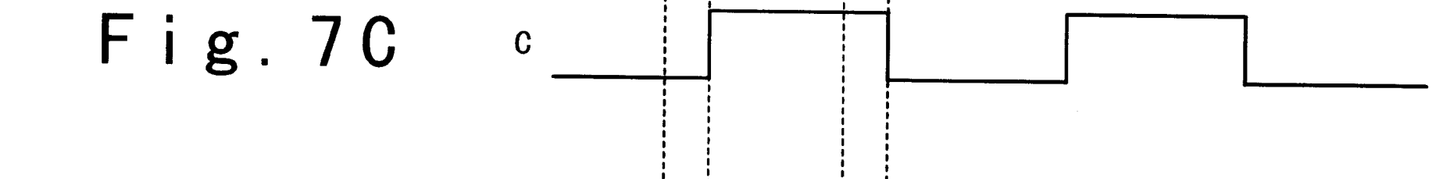
Figures 7D, 7E:
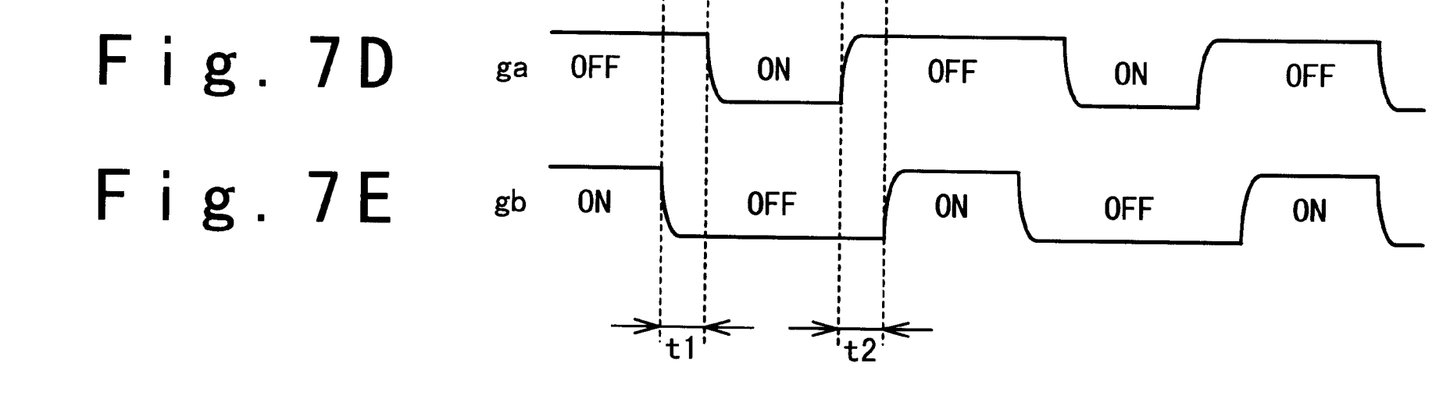

First, the drive control signals a and b shown in FIGS. 7A and 7B are supplied to the inverters 8 and 9, respectively. Thus, the inverters 8 and 9 generate the gate signals ga and gb which are supplied to the gates of the power MOS transistors, as shown in FIGS. 7D and 7E. Also, the drive control signals a and b are supplied to the RS latch 15 directly and via the inverter 14, respectively. Thus, the RS latch 15 generates the drive signal c which is supplied to the gates of the enhancing transistors 12 and 13, as shown in FIG. 7C. In this case, the drive control signals a and b are set to have delay times t1 and t2 such that the power MOS transistors 1 and 2 are not turned on at the same time. Thus, it can be prevented that current flows between the power supply 5 and the ground 6. That is, the voltage changes of the gate signals ga and gb are restrained through the enhancement of the current drive ability. Also, the generation of a through current between the power supply 5 and the ground 6 due to the power MOS transistors 1 and 2 being turned on at the same time can be prevented.

The values of capacitances 16 and 17 are fixed based on the sizes of the power MOS transistors 1 and 2, respectively. Therefore, as the inverter output resistor elements 18 and 19 become large, the current drive abilities of the inverters 8 and 9 decrease. Thus, the gate signals ga and gb change slowly so that the capacitances 16 and 17 are slowly charged or discharged. In this manner, the rising edge and the falling edge in the switching operations of the power MOS transistors 1 and 2 are made gentle.

Figure 8A:
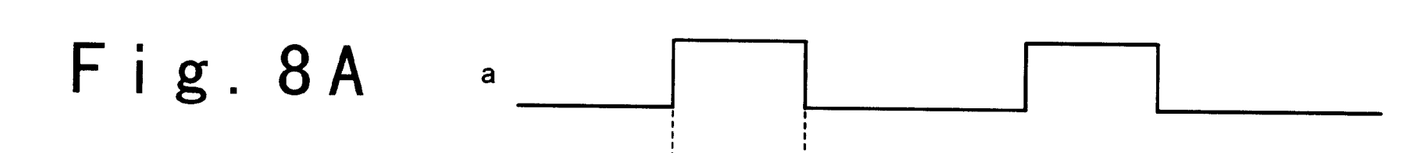
FIGS. 8A to 8E are timing charts of operation signals in the bridge circuit of FIG. 6.
Figure 8B:
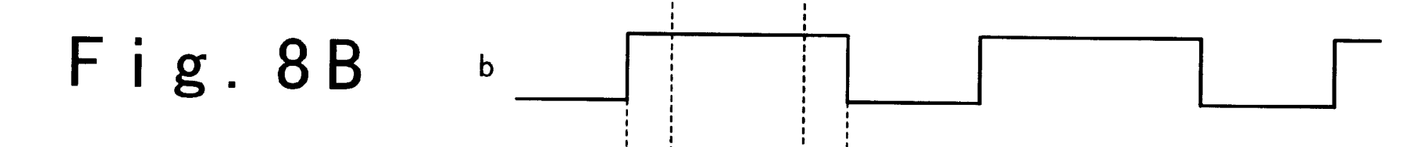
Figures 8C, 8D:
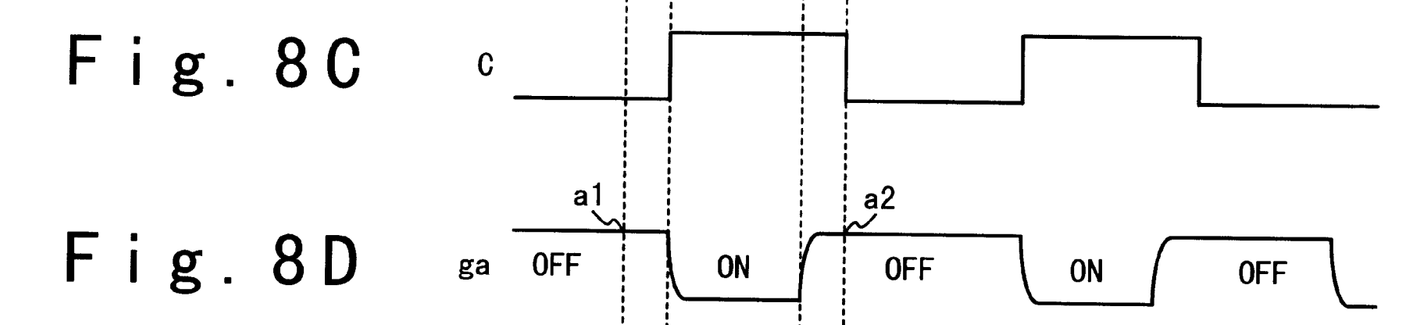
Figure 8E:
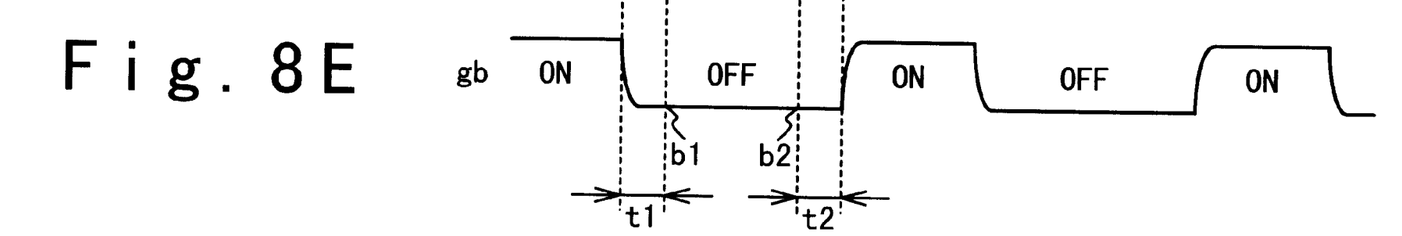

It is supposed that the power MOS transistors 1 and 2 are in the OFF state, as shown in FIG. 8D as t2. At this time, the gate signal ga is in the high level and the gate signal gb is in the low level, as shown in FIGS. 8D and 8E. Next, it is supposed that only the power MOS transistor 2 is changed from the OFF state to the ON state, while the power MOS transistor 1 is in the OFF state. In this case, because the gate signal gb goes to the high level so that the power MOS transistor 2 is turned on, the voltage of the node 31 goes to the voltage of the ground 6 in FIG. 6. Also, the voltage at a terminal of the capacitance 16 changes from the power supply voltage toward the ground.

Therefore, the capacitance 16 should be charged at this time. However, since the current drive ability of the inverter 8 to the power MOS transistor 1 decreases as mentioned above, the inverter 8 cannot immediately supply current as the gate signal ga to the capacitance 16. For this reason, the voltage at the terminal 32 of the capacitance 16 is pulled down toward the ground.

In this case, when the gate voltage exceeds a threshold level of the power MOS transistor 1, the power MOS transistor 1 is turned on for a very short time. Thus, the through current flows between the power supply and the ground, because the power MOS transistor 2 is in the ON state.

However, in the present invention, the drive signal c is in the high level as shown in FIG. 8C. Therefore, charging current is supplied from the power supply to the gate of the power MOS transistor 1 so that the capacitance 16 is charged. Therefore, the voltage at the terminal 32 of the capacitance 16 never exceeds the threshold voltage of the power MOS transistor 1 and is never pulled down to the ground. At the same time, the through current between the power supply and the ground can be restrained. In this manner, the current drive ability of the gate signal ga is enhanced by the enhancing transistor 12.

Also, it is supposed that the power MOS transistors 1 and 2 are in the OFF state, as shown in FIG. 8D as t1. At this time, the gate signal ga is in the high level and the gate signal gb is in the low level, as shown in FIGS. 8D and 8E. Next, it is supposed that only the power MOS transistor 1 changes from the OFF state to the ON state, while the power MOS transistor 2 is in the OFF state. In this case, because the gate signal ga goes to the low level so that the power MOS transistor 1 is turned on, the voltage of the node 31 goes to the voltage of the power supply 6 in FIG. 6. Also, the voltage at a terminal 31 of the capacitance 17 changes from a voltage toward the power supply voltage.

Therefore, the capacitance 17 should be charged at this time. However, the current drive ability of the inverter 9 to the power MOS transistor 2 is decreased as mentioned above. As a result, the inverter 9 cannot immediately pass current as the gate signal gb from the capacitance 17. For this reason, the voltage at the terminal 33 of the capacitance 17 is pulled up toward the power supply voltage.

In this case, when the gate voltage exceeds a threshold level of the power MOS transistor 2, the power MOS transistor 2 is turned on for a very short time. Thus, the through current flows between the power supply and the ground, because the power MOS transistor 2 is in the ON state.

However, in the present invention, the drive signal c is in the high level as shown in FIG. 8C. Therefore, charging current passes from the gate of the power MOS transistor 2 to the ground 6 so that the capacitance 17 is charged. Therefore, the voltage at the terminal 33 of the capacitance 17 never exceeds the threshold voltage of the power MOS transistor 2 and is never pulled up to the power supply voltage. At the same time, the through current between the power supply and the ground can be restrained. In this manner, the current drive ability of the gate signal gb is enhanced by the enhancing transistor 13.

Also, the enhancing transistors 12 and 13 function to pass discharge current from the capacitances 16 and 17, when the power MOS transistors are turned off.

As described above, according to the present invention, the voltage change of the gate signal to the power MOS transistor can be restrained. Also, an erroneous operation of the power MOS transistor can be prevented. Thus, the generation of the through current between the power supply and the grounds and the destruction of the power MOS transistor can be prevented.

What is claimed is:

1. A transistor protecting circuit for an H bridge circuit in which a first P-channel transistor having a first gate and a first N-channel transistor having a second gate are provided in series between a first power supply and a ground through a first node provided between said first P-channel transistor and said first N-channel transistor, and a second P-channel transistor and a second N-channel transistor are provided in series between the first power supply and the ground through a second node provided between said second P-channel transistor and said second N-channel transistor, a load being connected between said first node and said second node, said transistor protecting circuit comprising:

a first buffer inverting a first control signal to a first gate signal which is supplied to said first gate of said first P-channel transistor via a first line;

a second buffer inverting a second control signal to a second gate signal which is supplied to said second gate of said first N-channel transistor via a second line; and an enhancing circuit connected to said first gate and second gate via said first line and said second line, respectively;

wherein said enhancing circuit supplies first current to said first gate via said first line when said first N-channel transistor is turned on in response to said second gate signal while said first P-channel transistor is in an off state in response to said first gate signal, and supplies second current to said ground via said second line when said first P-channel transistor is turned on in response to said first gate signal while said first N-channel transistor is in an off state in response to said second gate signal.

2. A transistor protecting circuit according to claim 1, wherein said enhancing circuit includes:

a first enhancing transistor connected to said first line wherein said first transistor passes said first current into said first line, and a second enhancing transistor connected to said second line wherein said second transistor passes said second current from said second line.

3. A transistor protecting circuit according to claim 2, wherein said enhancing circuit includes a first timing circuit generating said first drive signal based on said first control signal and second control signal.

4. A transistor protecting circuit according to claim 3, wherein said first enhancing transistor is a P-channel control transistor provided between a second power supply and said first line, and passing said first current from said second power supply to said first line in response to a first drive signal, and said second enhancing transistor is a N-channel control transistor provided between said ground and said second line, and passing said second current from said second line to said ground in response to said first drive signal.

5. A transistor protecting circuit according to claim 4, wherein said first timing circuit includes a first flip-flop circuit set in response to a rising edge of said first control signal and reset in response to a falling edge of an inversion signal of said second control signal.

6. A transistor protecting circuit according to claim 2, wherein an internal resistor of said first buffer is larger than an ON resistor of said first enhancing transistor, and an internal resistor of said second buffer is larger than an ON resistor of said second enhancing transistor.

* * * * *